United States Patent [19]

Jeong et al.

[11] Patent Number: 5,523,250
[45] Date of Patent: Jun. 4, 1996

[54] METHOD OF MANUFACTURING A MOSFET WITH LDD REGIONS

[75] Inventors: Jae G. Jeong, Kyoungki-do; Jae C. Om, Seoul, both of Rep. of Korea

[73] Assignee: Hyundai Electronics Industries Co., Ltd., Kiyoungki-Do, Rep. of Korea

[21] Appl. No.: 113,988

[22] Filed: Aug. 30, 1993

[30] Foreign Application Priority Data

Aug. 31, 1992 [KR] Rep. of Korea ............ 92-15699
Aug. 31, 1992 [KR] Rep. of Korea ............ 92-15700

[51] Int. Cl.⁶ .................................... H01L 21/265
[52] U.S. Cl. ...................... 437/44; 437/37; 437/29
[58] Field of Search .................... 437/44, 37, 29

[56] References Cited

U.S. PATENT DOCUMENTS 5,196,361  3/1993  Ong et al. ...................... 437/43
5,272,098  12/1993  Smayling et al. ............... 437/41

FOREIGN PATENT DOCUMENTS 0071971  6/1981  Japan ............................ 437/44

*Primary Examiner*—Tom Thomas
*Assistant Examiner*—Lynne A. Gurley
*Attorney, Agent, or Firm*—Morgan & Finnegan

[57] ABSTRACT

This invention relates to a method of manufacturing a MOSFET with LDD regions, high integrated semiconductor, wherein a photoresist pattern for a source/drain implant mask is formed to sufficiently cover the part where the edge between field oxide layer and LDD regions are crossed. As a result, at the place damaged from the formation of spacer at the side wall of gate electrode, high concentrated impurity should not be implanted so as to form the source/drain region within LDD regions. Consequently, this invention prevents the weakening of breakdown voltage or increase of leakage current.

11 Claims, 6 Drawing Sheets

METHOD OF MANUFACTURING A MOSFET WITH LDD REGIONS

BACKGROUND OF THE INVENTION

1. Field of Invention

This invention relates to a manufacturing a MOSFET, of high integrated semiconductor device and more particularly, to a method of manufacturing a MOSFET with LDD (Lightly Doped Drain) region.

2. Description of the Prior Art

In parallel with the emergence of high integrated semiconductor device, the integrity of chips increase while the channel length of transistor decreases. The decrease of channel length in transistor causes some problems associated with DIBL (drain induced barrier lowering), hot-carrier effect and short-channel effect. To overcome this, a MOSFET with LDD regions is being widely used.

With reference to FIG. 1 and FIG. 2A through FIG. 2D, the conventional method for forming a MOSFET with LDD will now be described.

Figure 1:
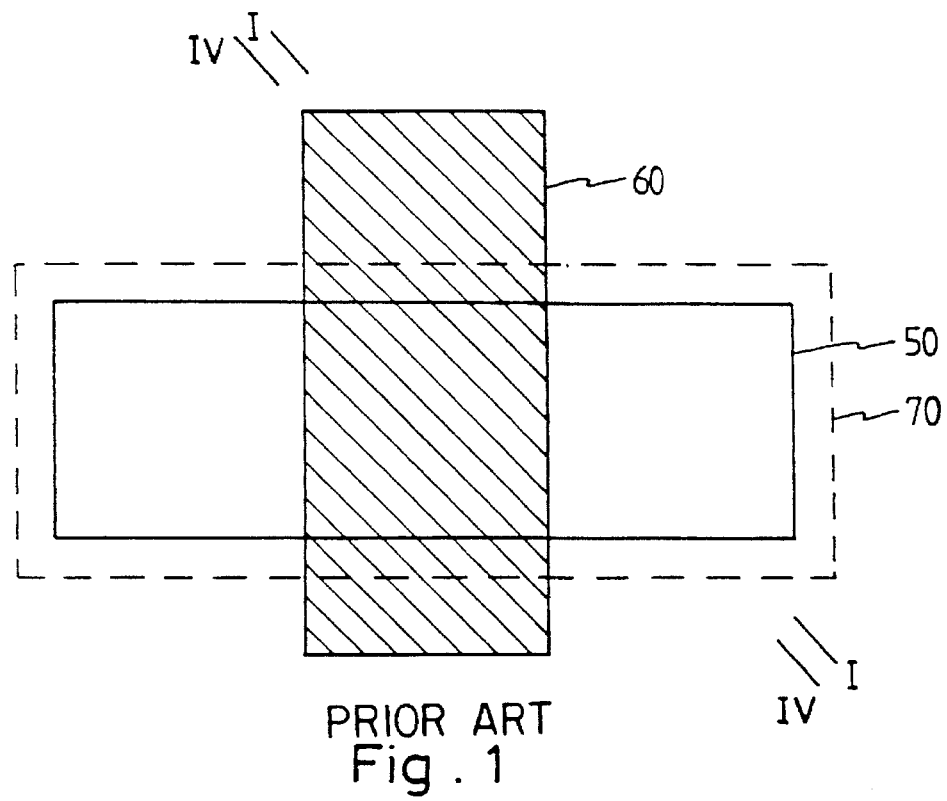
FIG. 1 is a layout view illustrating aligned masks in order to manufacture a MOSFET with LDD regions, in which a gate electrode mask (60) is arranged perpendicular to an active mask (50), and the active mask (50) is overlapped with a source/drain implant mask (70) which is larger in width than the active mask (50).
Figure 2A:
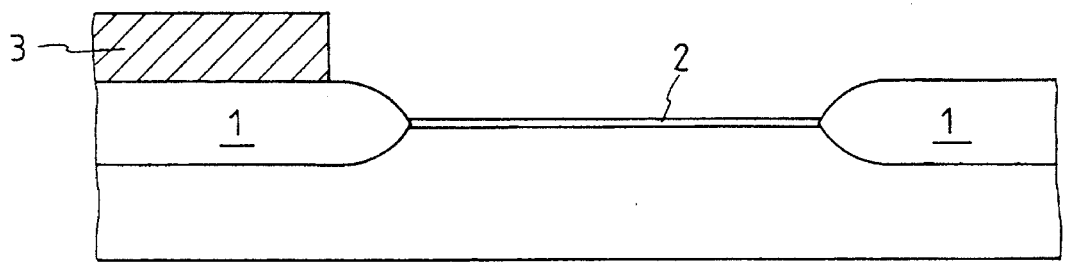
FIG. 2A to 2D are cross-sectional views illustrated according to I—I of FIG. 1, in manufacturing a MOSFET with LDD regions fabricated by the existing technology.
Figure 2B:
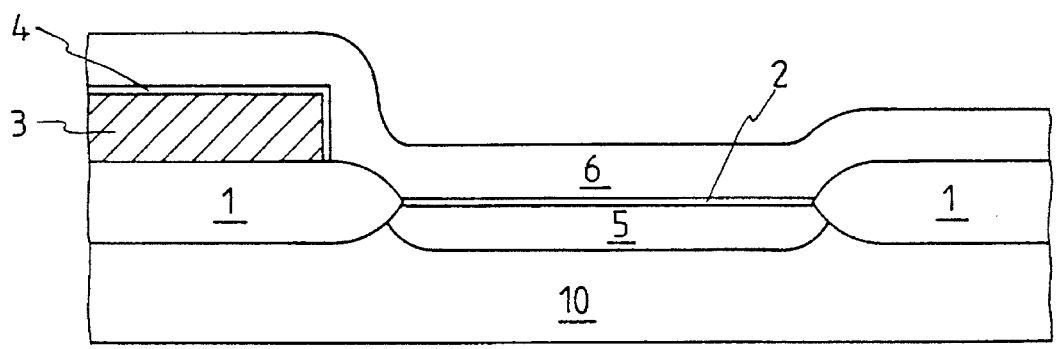
Figure 2C:
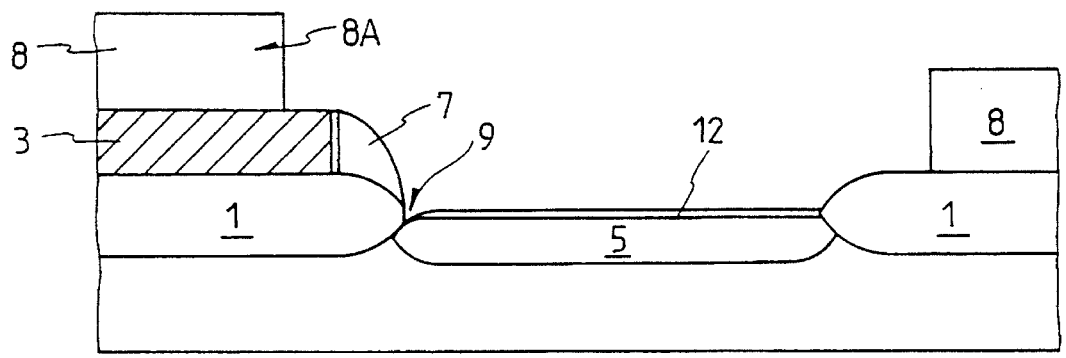
Figure 2D:
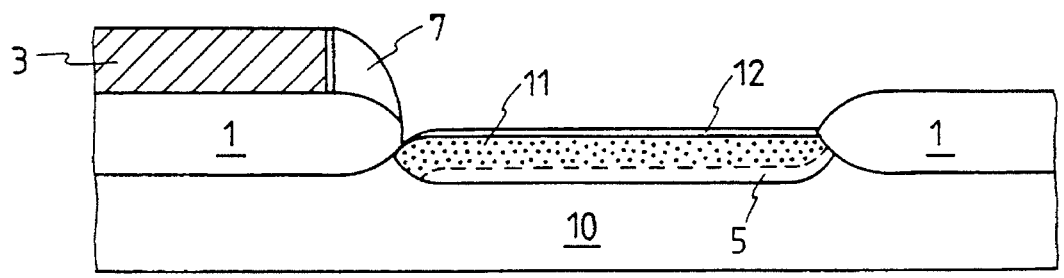
Figure 2E:
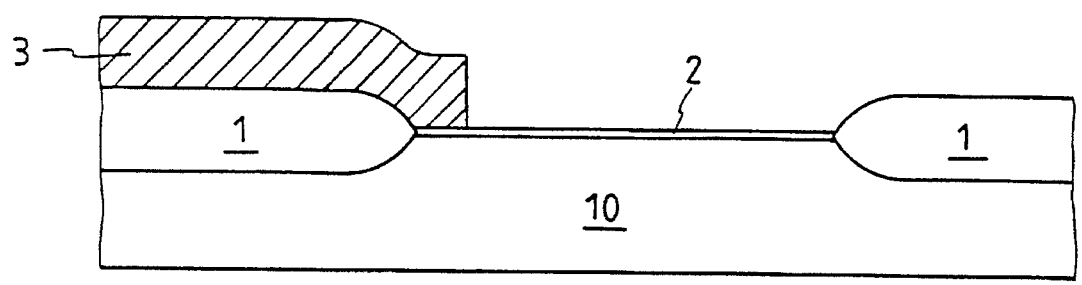

As shown in FIG. 2A, a field oxide layer 1 providing isolation between devices is formed by LOCOS (local oxidation of silicon) process on a silicon substrate 10 having p-type impurity as the 1st conductive type which is not formed on the active region, a gate oxide layer 2 is formed on the silicon substrate of the active region, and a gate electrode 3 is formed on a predetermined region of both active region and field oxide layer 1 as is further illustrated by FIG. 2E which is a cross-sectional view corresponding to FIG. 2A but according to IV—IV of FIG. 1.

As shown in FIG. 2B, an oxide layer 4 is formed on the surface of the gate electrode 3, n-type impurity of low concentration as the 2nd conductive type is implanted to the silicon substrate 10 by ion implantation to form the LDD region 5, and an insulating layer 6, for example an oxide layer, is formed on the whole structure.

As shown in FIG. 2C, the insulating layer 6 is etched by anisotropic etch to form the spacer 7 at both side walls of the gate electrode 3. During this etching process, both gate oxide layer 2 on the silicon substrate 10 and oxide layer 4 on the gate electrode 3 are etched. An oxide layer 12 is formed on the exposed silicon substrate 10, and then photoresist is coated on the whole structure and patterned into photsoresist layer 8A using the source/drain implant mask 70. FIG. 2C also shows that the photoresist pattern 8A is overlapped on both gate electrode 3 and field oxide layer 1, and that during the anisotropic etch process, the etching causes some damages 9 to the edge of Bird's Beak of the field oxide film 1.

As shown in FIG. 2D, a source/drain region 11 is formed by implanting n-type impurity of high concentration as the 2nd conductive type into the LDD region 5, and the photoresist layer pattern 8A is removed. FIG. 2D also shows that during the implantation process of said impurity, the source/drain region 11 from the damaged area of the field oxide layer 1 is implanted at the outside of the LDD region 5 so that the shaping of the LDD region 5 is defined as abrupt junction.

The prior art has recognized disadvantages in that during the etching process to form the spacer at the side of the gate electrode, a part of Bird's Beak of the field oxide layer is etched at the overlapping site between the field oxide layer and LDD region. Therefore, during the process to form the source/drain by ion implantation of n+ or p+ impurity of high concentration hereafter, the impurity of high concentration at the etched site of Bird's Beak of the field oxide layer is implanted at the outside of the LDD region, thus the shaping of the LDD region is defined as abrupt junction. This abrupt junction, which acts electrically as an unstable factor, might weaken the breakdown voltage of a MOSFET or increase junctive leakage current.

SUMMARY OF THE INVENTION

To be free of the aforementioned defects, accordingly, it is a primary object of the present invention to provide a method of manufacturing a MOSFET with LDD regions, having; in the etching process where the spacer at the side wall of gate electrode is formed, the photoresist layer pattern for source/drain implant mask is formed on the Bird's Beak of field oxide layer having a possibility of damage, and high concentrated purity is deposited.

The formation of the photoresist layer pattern have the following advantages;

- can avoid the implantation of high concentrated ion into the silicon substrate damaged by the anisotropic etch, being responsible for the formation of spacer;
- can cope with some defects associated with abrupt junction in the shaping of the LDD;
- can prevent either the weakening of breakdown voltage or the increase of leakage current, in that the source/drain region is completely surrounded by the LDD region.

BRIEF DESCRIPTION ON THE DRAWINGS

FIG. 1 is a lay-out view illustrating aligned masks in order to manufacture a MOSFET with LDD regions according to a prior art.

FIG. 2A to FIG. 2D are cross-sectional views illustrating sequential steps to manufacture a MOSFET with LDD regions according to the prior art.

FIG. 2E is a cross-sectional view corresponding to FIG 2A and according to IV—IV of FIG. 1.

Figure 3:
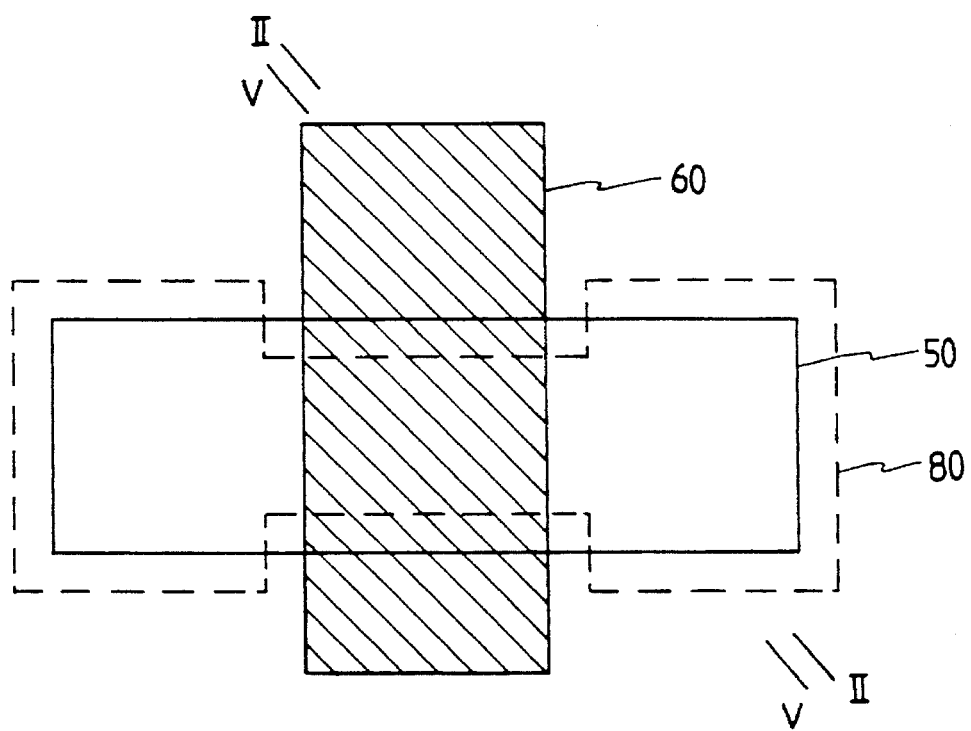

FIG. 3 is a lay-out view illustrating aligned masks in order to manufacture a MOSFET with LDD regions according to the first embodiment of the present invention.

Figure 4:
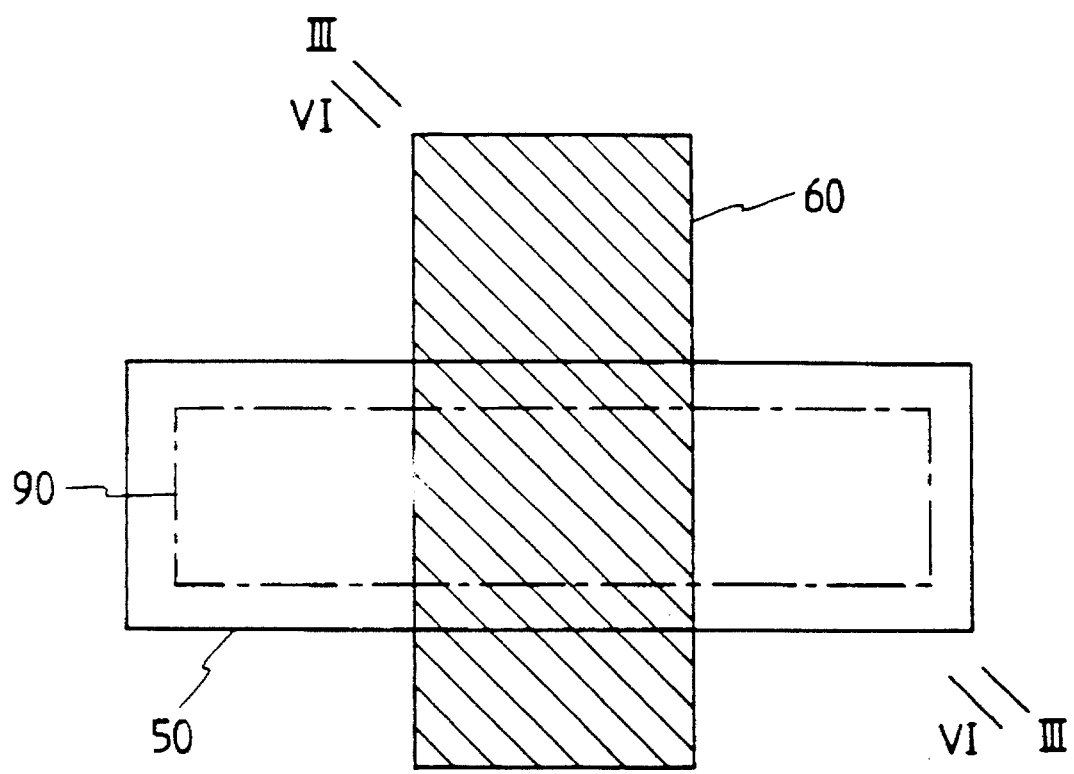

FIG. 4 is a lay-out view illustrating aligned masks in order to manufacture a MOSFET with LDD regions according to the second embodiment of the present invention.

FIG. 5A to FIG. 5D are cross-sectional views illustrating sequential steps to manufacture a MOSFET with LDD regions according to the first embodiment of the present invention.

Figure 5E:
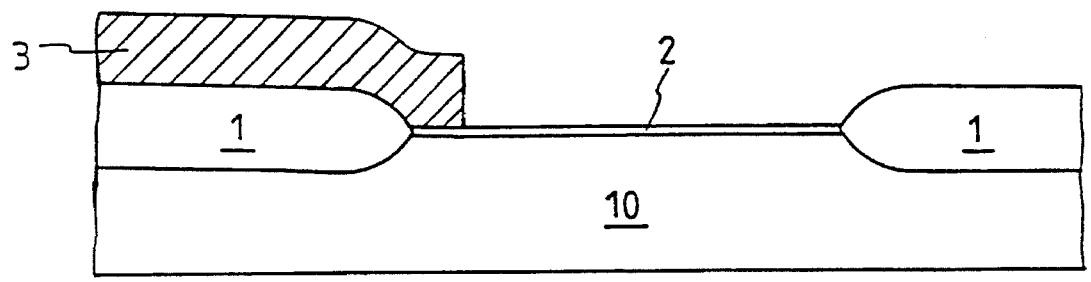
Figure 5A:
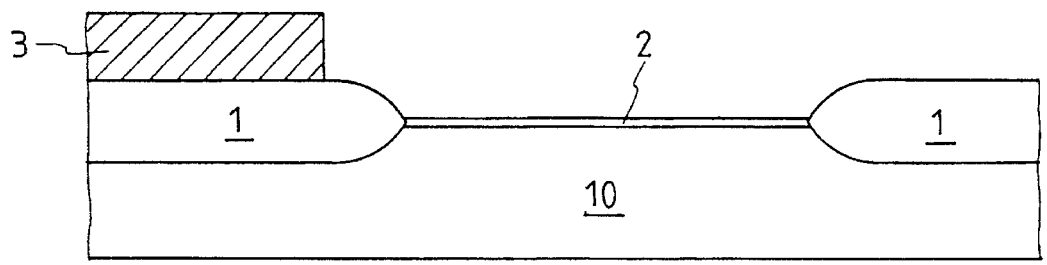

FIG. 5E is a cross-sectional view cross-sectional view corresponding to FIG.5A and according to V—V of FIG. 3.

FIG. 6A to FIG. 6D are sectional views illustrating sequential steps to manufacture a MOSFET with LDD regions according to the second embodiment of the present invention.

Figure 6E:
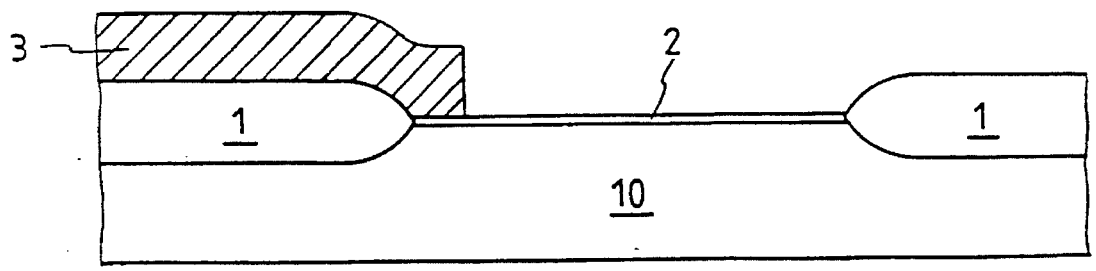
Figure 6A:
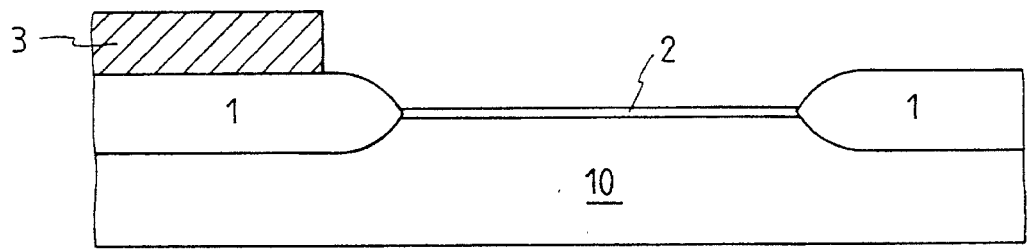

FIG. 6E is a cross-sectional view corresponding to FIG. 6A and according to VI—VI of FIG. 4.

DETAILED DESCRIPTION OF THE PREFERRED EMBODIMENTS

The novel feature of the present invention may be understood from the accompanying description when taken in conjunction with the accompanying drawings similar reference characters refer to similar parts throughout the several views of the drawings.

FIG. 3 is a lay-out view illustrating aligned masks in order to manufacture a MOSFET with LDD regions according to the first embodiment of the invention, in which a gate electrode mask 60 is arranged perpendicularly to an active mask 50, and a source/drain implant mask 80, being larger than the active mask 50 in width, is arranged to be overlapped with the active mask 50, but at the place where the gate electrode mask 60 and active mask 50 are overlapped, the source/drain implant mask 80, being smaller in width than the active mask 50, is arranged to be overlapped with the active mask 50

FIG. 4 is a layout view illustrating aligned masks in order to manufacture a MOSFET with LDD regions according to the second embodiment of the invention, in which a gate electrode mask 60 is arranged perpendicularly to an active mask 50, and a source/drain implant mask 90 having lesser width than the active mask 50 is arranged to be overlapped with the active mask 50.

FIG. 5A to FIG. 5D are cross-sectional views illustrated according to II—II of FIG. 3, in manufacturing a MOSFET with LDD regions fabricated by the first embodiment of the invention.

As shown in FIG. 5A, a field oxide layer 1 is formed by the LOCOS process on silicon substrate 10 having p-type impurity as the 1st conductive type, a gate oxide layer 2 is formed on an exposed active region in the silicon substrate 10, and a gate electrode 3 is formed on a predetermined region of both gate oxide layer 2 and field oxide layer 1 as is further illustrated by FIG. 5E which is a cross-sectional view corresponding to FIG. 5A but according to V—V of FIG. 3.

Figure 5B:
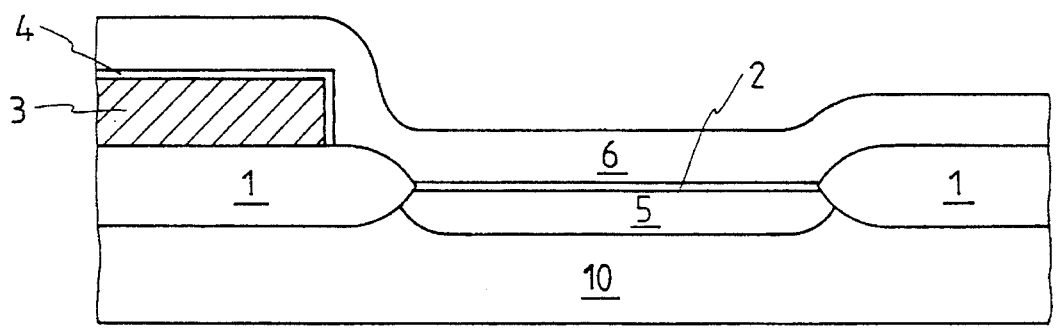

As shown in FIG. 5B, an oxide layer 4 is formed on the surface of the gate electrode 3, n-type impurity of low concentration as the 2nd conductive type is implanted to the silicon substrate 10 by ion implantation to form the LDD region 5, and an insulating layer 6, for example, an oxide layer, on the whole structure is formed.

Figure 5C:
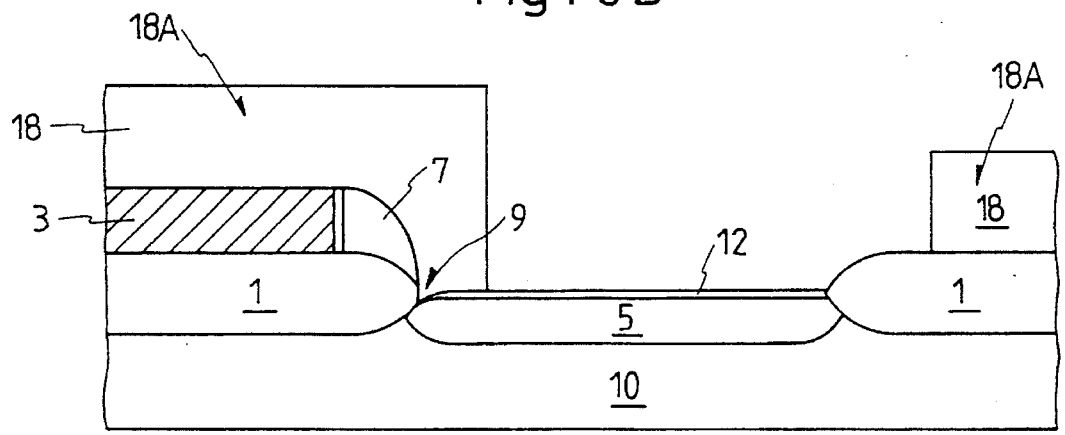

As shown in FIG. 5C, the insulating layer 6 is etched by anisotropic etch to form the spacer 7 at the side wall of the gate electrode 3. Then, photoresist is coated on the whole structure and patterned into photoresist layer 18A using the source/drain implant mask 80, thus constituting the overlapped part of both LDD region 5 and field oxide layer 1 covered with the photoresist layer pattern 18A. During the anisotropic etch process, some damages 9 inevitably occur since the etching is extended even to the edge of Bird's Beak of the field oxide layer 1. However, the photoresist pattern 18A covers the damaged part, thereby preventing any occurrence of problem in the process of high concentrated ion implantation as a post-process.

Figure 5D:
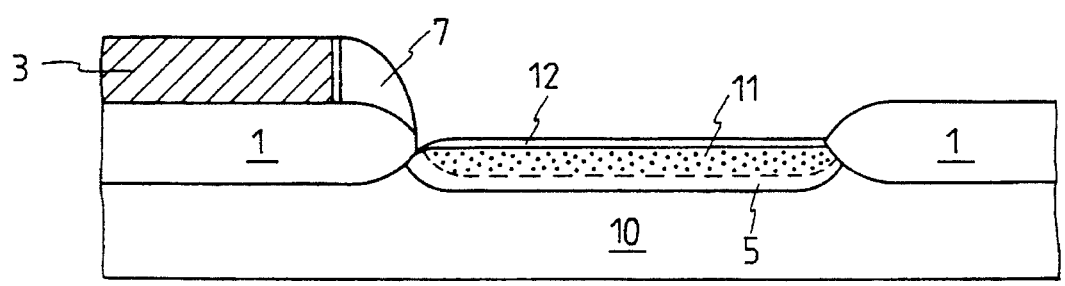

As shown in FIG. 5D, the source/drain region 11 is formed by implanting n-type impurity of high concentration as the 2nd conductive type into the LDD region 5, and the photoresist pattern 8A is removed.

According to the first embodiment of the invention, the photoresist pattern 18A for the source/drain implant mask covers the parts damaged 9 to the edge of Bird's Beak of the field oxide layer 1 during the anisotropic etch, thus avoiding any possible defects in the next process, say, a high concentrated ion implantation process.

FIG. 6A to FIG. 6D are sectional views illustrated according to III—III of FIG. 4, in manufacturing a MOSFET with LDD regions fabricated by the second embodiment of the invention.

As shown in FIG. 6A, a field oxide layer 1 is formed on p-type silicon substrate 10 according to the LOCOS process. Then, the gate oxide layer 2 is formed on an exposed active region in the silicon substrate 10 and the gate electrode 3 is formed on a predetermined region of both gate oxide layer 2 and field oxide layer 1 as is further illustrated by FIG. 6E which is a cross-sectional view corresponding to FIG. 6A but according to VI—VI of FIG. 4.

Figure 6B:
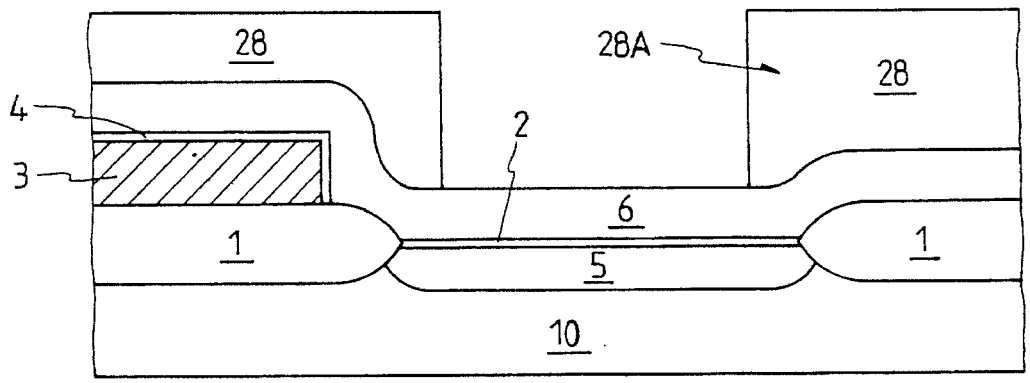

As shown in FIG. 6B, an oxide layer 4 is formed on the surface of gate electrode 3, and n-type impurity of low concentration as the 2nd conductive type, is implanted to the silicon substrate 10 by ion implantation to form the LDD region 5, and an insulating layer 6 on the whole structure is formed by an oxide layer of proposed thickness.

Then, a photoresist layer 28 is coated and photoresist is coated on the whole structure and patterned into photoresist layer 28A by a lithographic process by using the source/drain implant mask 90. Also, FIG. 6 shows that the neighboring parts between the field oxide layer 1 and LDD region 5 is covered by the photoresist pattern 28A.

Figure 6C:
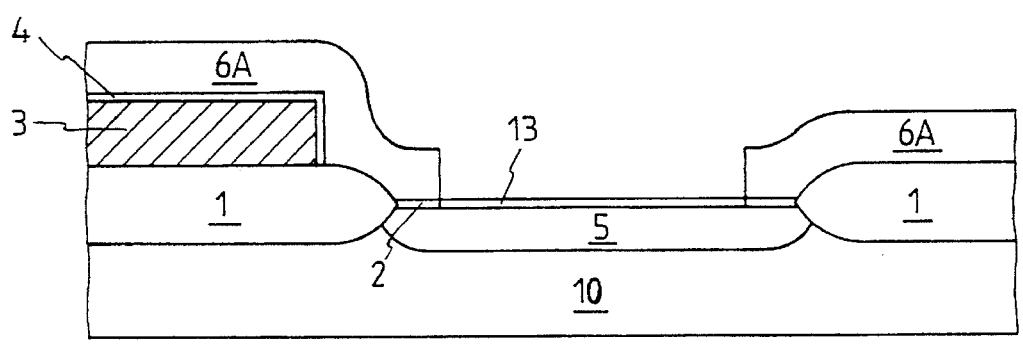

As shown in FIG. 6C, after the process of FIG. 6B, the exposed insulating layer 6 is etched to form the insulating pattern 6A. With the removal of the photoresist pattern 28A, the gate oxide layer 2 is etched during the etching process of the insulating layer 6, thus forming a thin oxide layer 13 on the surface of exposed LDD region 5.

Figure 6D:
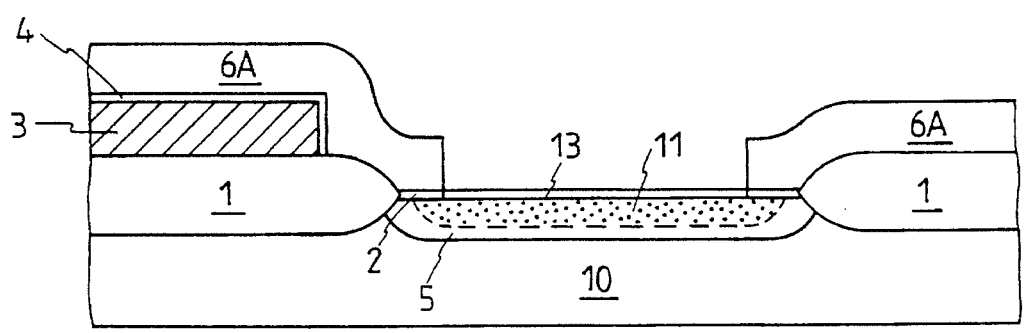

As shown in FIG. 6D, n-type impurity of high concentration as the 2nd conductive type, is implanted to the LDD region 5 by ion implantation to form the source/drain region 11 within the LDD region 5.

According to the second embodiment of the invention, the insulating pattern 6A during the ion implantation of high concentrated impurity protects adequately the edge of Bird's Beak of the field oxide layer 1, so that no abrupt junction (for example, the source/drain region 11 protruded to the lowering part of LDD region) occurs.

As described above, though an edge part of Bird's Beak is etched during the etching process of forming the spacer, the invention prevents not only the weakening of breakdown voltage in the source/drain junction, but also the increase of junctive leakage current.

Although this invention has been described in its preferred form with a certain degree of particularity, it is appreciated by those skilled in the art that the present disclosure of the preferred form has been made only by way of example and that numerous changes in the details of the construction, combination, and arrangement of parts may be resorted to without departing from the spirit and scope of the invention.

What is claimed is:

1. A method of manufacturing a MOSFET with LDD regions in a silicon substrate of a first conductivity type, said method comprising the steps of:

forming a field oxide layer on the silicon substrate, said field oxide layer having an opening to expose a region of said silicon substrate;

forming a gate oxide layer on the exposed region of the silicon substrate;

forming a gate electrode on a portion of both the field oxide layer and the gate oxide layer, said gate electrode thereby having an edge along the gate oxide layer and along the field oxide layer;

forming LDD regions by implanting low concentrated impurity of a second conductivity type into said region of the silicon substrate which is not overlayed by said gate electrode, said LDD regions self-aligned to said gate electrode;

forming an insulating layer on the whole structure, etching said insulating layer by anisotropic etch process to form a spacer at both side walls along the edges of said gate electrode;

forming a pattern in a photoresist layer for a source/drain implant mask, said photoresist layer overlaying portions of regions within said opening where the gate electrode edge crosses over the field oxide layer;

forming source/drain regions within said LDD region by implanting high concentrated impurity of the second conductivity type into LDD region; and removing said photoresist for said source/drain implant mask.

2. The method of manufacturing a MOSFET with LDD regions claimed in claim 1, wherein said first conductivity type impurity consists of p-type.

3. The method of manufacturing a MOSFET with LDD regions claimed in claim 1, wherein said second conductivity type impurity consists of n-type.

4. The method of manufacturing a MOSFET with LDD regions claimed in claim 1, wherein said insulating layer includes oxide layer.

5. The method according to claim 1, wherein said step of forming LDD regions is implemented before said step of forming an insulating layer.

6. A method of manufacturing a MOSFET with LDD regions in a silicon substrate of a first conductivity type, said method comprising the steps of:

forming a field oxide layer on the silicon substrate, said field oxide layer having an opening to expose a region of said silicon substrate;

forming a gate oxide layer on the exposed region of the silicon substrate;

forming a gate electrode on a portion of both the field oxide layer and the gate oxide layer, said gate electrode thereby having an edge along the gate oxide layer and along the field oxide layer;

forming LDD regions by implanting low concentrated impurity of a second conductivity type into said region of the silicon substrate which is not over-layed by said gate electrode, said LDD regions self-aligned to said gate electrode;

forming an insulating layer on the whole structure, forming a pattern in a photoresist layer for a source/drain implant mask, said photoresist layer overlaying said opening along a portion of said field oxide layer;

forming an insulating pattern by etching the exposed said insulating layer using said photoresist as mask;

removing said photoresist for the source/drain implant mask; and forming source/drain region within LDD regions by implanting high concentrated impurity of the second conductivity type into LDD regions.

7. The method of manufacturing a MOSFET with LDD regions claimed in claim 6, wherein said first conductivity type impurity consists of p-type.

8. The method of manufacturing a MOSFET with LDD regions claimed in claim 6, wherein said second conductivity type impurity consists of n-type.

9. The method of manufacturing a MOSFET with LDD regions claimed in claim 6, wherein said insulating pattern is formed and then, an oxide layer is thinly formed on the exposed LDD regions.

10. The method of manufacturing a MOSFET with LDD regions claimed in claim 6, said insulating layer includes oxide layer.

11. The method according to claim 6, wherein said step of forming LDD regions is implemented before said step of forming an insulating layer.

* * * * *